(12) United States Patent
Zheng et al.

(10) Patent No.: US 7,615,428 B2
(45) Date of Patent: Nov. 10, 2009

(54) VERTICAL MEMORY DEVICE AND METHOD

(75) Inventors: Jun-Fei Zheng, Westport, CT (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 11/939,686

(22) Filed: Nov. 14, 2007

(65) Prior Publication Data

US 2008/0070364 A1 Mar. 20, 2008

Related U.S. Application Data

(62) Division of application No. 11/096,390, filed on Mar. 31, 2005, now Pat. No. 7,312,490.

(51) Int. Cl.
*H01L 21/336* (2006.01)
*H01L 21/8234* (2006.01)

(52) U.S. Cl. .................. 438/197; 438/238; 438/381; 257/E21.17; 257/E21.229; 257/E21.304; 257/E21.278; 257/E21.293; 257/E21.646

(58) Field of Classification Search .................. 438/197, 438/238, 381, 199, 253, 264, 257, 680, 692, 438/706, 723, 724, 743, 744, 756, 757, 753, 438/954
See application file for complete search history.

(56) References Cited

U.S. PATENT DOCUMENTS

| 4,979,004 | A | * | 12/1990 | Esquivel et al. | 257/316 |
|-----------|---|---|---------|-----------------|---------|
| 5,045,490 | A | * | 9/1991 | Esquivel et al. | 438/197 |
| 5,448,663 | A | * | 9/1995 | Faulkner et al. | 385/27 |
| 5,633,519 | A | * | 5/1997 | Yamazaki et al. | 257/315 |
| 5,739,567 | A | * | 4/1998 | Wong | 257/316 |
| 6,433,382 | B1 | * | 8/2002 | Orlowski et al. | 257/315 |
| 2002/0167839 | A1 | * | 11/2002 | Forbes et al. | 365/185.17 |
| 2004/0197994 | A1 | * | 10/2004 | Hung et al. | 438/257 |
| 2004/0245562 | A1 | * | 12/2004 | Hsiao et al. | 257/314 |

* cited by examiner

*Primary Examiner*—David Nhu
(74) *Attorney, Agent, or Firm*—Kacvinsky LLC

(57) ABSTRACT

Method and apparatus are described for a memory cell includes a substrate, a body extending vertically from the substrate, a first gate having a vertical member and a horizontal member and a second gate comprising a vertical member and a horizontal member. The first gate is disposed laterally from the body and the second gate is disposed laterally from the first gate. The horizontal member of the first gate overlaps the horizontal member of the second gate.

9 Claims, 16 Drawing Sheets

VERTICAL MEMORY DEVICE AND METHOD

CROSS-REFERENCE TO RELATED APPLICATION

This application is a divisional of U.S. application Ser. No. 11/096,390, filed Mar. 31, 2005; now U.S. Pat. No. 7,312,490.

BACKGROUND

In recent years non-volatile memories have become established in a variety of electronic systems, especially mobile systems. For example, non-volatile memories are widely employed in a variety of electronic products such as portable computers, digital cameras, mobile telephones, and other similar products that are becoming increasingly smaller in size and require increasingly higher memory storage capacity to support advanced applications. To keep pace with these advanced applications, non-volatile memories are being manufactured with higher levels of integration, faster response, higher reliability, lower power consumption, and increased storage capacity.

One way to achieve these ever more demanding requirements is to downscale the non-volatile memory cells. Higher storage capacity for non-volatile memories may be achieved by increasing the memory cell density and reducing the size of cell components such as the floating gate and the control gate, among other elements. Conventional planar semiconductor memory architectures require too much real estate per memory cell and are difficult to downscale to achieve denser cell layouts to effectively increase the memory capacity on a wafer.

Vertically oriented memory cell architectures having a thin vertical Si body and two sided flash cells, however, may be configured to achieve a denser memory cell layout. Although the vertical nature of these memory cell structures provide for denser memory cell layout, these structures lack the necessary overlapping areas between the control gate and the floating gate to yield a suitable gate coupling ratio (GCR). The importance of a suitable GCR is explained below.

Non-volatile memories, such as flash cells, may be fabricated using a metal-oxide-semiconductor (MOS) process. An MOS memory cell array may comprise electrically isolated floating gate structures formed of polycrystalline silicon (polysilicon) surrounded by a silicon dioxide ($SiO_2$) insulative layer. The floating polysilicon gate is electrically isolated from the substrate regions of the semiconductor by the $SiO_2$ insulative layer. Cells of this type also may comprise an n-channel MOS transistor.

The cell operation is controlled by storing electron charge on the electrically isolated floating polysilicon gate. A linear capacitor network is formed of the $SiO_2$ insulative layers surrounding the floating gate and the terminals of the source, drain, transistor channel, and polysilicon control gate. Electrical access to the floating gate is only through this linear capacitor network. The capacitance of the cell may be defined in terms of capacitive coupling ratios, including, for example, the gate coupling ratio (GCR), drain coupling ratio (DCR), and source coupling ratio (SCR). Due to the capacitive coupling, any change in control gate voltage produces a change in floating gate voltage in accordance with the GCR. A suitable GCR for proper memory operation is ~0.6. This may be referred to as a "golden ratio" for memory cell structures that governs the development of the scaled memory cells, such as, scaled flash memory cells, for example.

Due to the horizontal orientation of the gates in conventional planar flash memory cells, for example, a suitable gate coupling ratio of ~0.6 may be achieved by extending the floating gate and the control gate laterally (e.g., horizontally) into the isolation area to increase the overlapping portions of the gates. The amount of overlapping determines the capacitance coupling between the gates and thus the overlapping regions may be adjusted to yield a suitable or desirable GCR. Vertical flash cell structures, however, do not have an equivalent isolation area available to extend the gates, and thus, increasing or tuning the GCR in a vertical memory structure is not as trivial as in the planar structures. Accordingly, conventional vertical memory structures have a GCR of ~0.33, which is substantially below the desired golden ratio.

DETAILED DESCRIPTION

Figure 1:
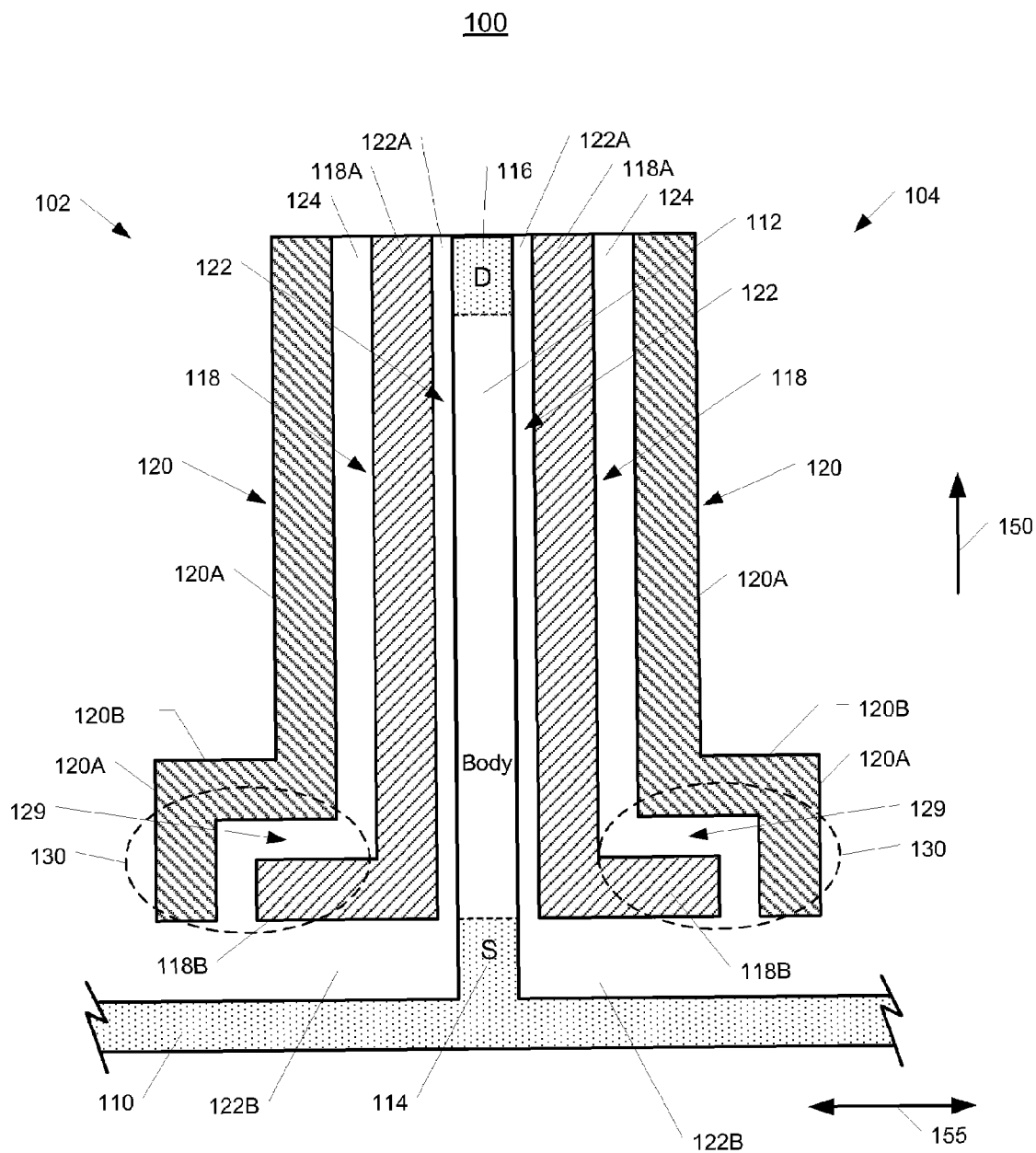
FIG. 1 illustrates a schematic cross-sectional view of one embodiment of a memory device 100.

FIG. 1 illustrates schematic cross-sectional view of one embodiment of a memory device 100 comprising a first memory cell 102 and a second memory cell 104. In one embodiment, the memory cells 102, 104 are formed back-to-back with a common semiconductor body 112. Other embodiments of the memory device 100 may comprise non-volatile ultra-high density electrically erasable and programmable read only memories (EEPROM). The memory cells 102, 104 form only a single pair of memory cells in a memory device comprising an array of multiple addressable memory cells, for example. In one embodiment, the memory device 100 may be a flash EEPROM, which provides simultaneous erasure of multiple bits, for example. Embodiments of the memory device 100, however, may comprise other semiconductor memory devices, such as static or dynamic random access memories (SRAMs and DRAMs, respectively), synchronous random access memories, or other types of memories that include a matrix of selectively addressable memory cells. In one embodiment, the memory device 100 may comprise a three-dimensional non-volatile memory device having a gate portion that extends in a substantially orthogonal direction away from the substrate. Accordingly, in one embodiment, such gate structures may be referred to as vertical gate structures. Memory cells comprising vertical gate structures and corresponding select devices may be integrated on a much smaller surface area of a semiconductor substrate to provide a denser memory array, for example. In the following description, the terms vertical and horizontal are used merely to describe the relative orientation of the gates to the substrate where the vertical direction is substantially orthogonal to the horizontal direction. The embodiments, however, are not limited in this context.

Embodiments of the memory device 100 may be fabricated using standard MOS processing. The memory device 100 may be an n-channel device. Peripheral circuits to select, address, read from, and write to the memory device 100 may employ either n-channel or complementary MOS (CMOS) devices, among other devices. In the following description, the term substrate generally refers to any structure on which integrated circuits may be formed, and also to such structures during the various stages of the integrated circuit fabrication process. The substrates may comprise both doped and undoped semiconductors, epitaxial layers of semiconductor on a supporting semiconductor or insulating material, combinations of such layers, as well as other known structures, for example. Throughout the drawings and written description, like numerals describe substantially similar components throughout the several views. The embodiments described herein, however, are not limited to the context in which they may be described.

Referring again to FIG. 1, one embodiment of the memory device 100 comprises a substrate 110 and a body 112 formed thereon. The substrate extends along direction 155, which in one embodiment may be referred to as the 'horizontal' direction. The body 112 extends away from the substrate 110 along direction 150 such that it is oriented substantially orthogonal to the substrate 110. In one embodiment, direction 150 may be referred to as the 'vertical' direction. In one embodiment, the body 112 may be formed of Si or other semiconductor material. The body 112 has heavily doped regions forming a source 114 and a drain 116. As previously discussed, the memory device comprises a first memory cell 102 and a second memory cell 104. Each memory cell 102, 104 may comprise one or more floating gates 118 located laterally on either side of the vertical body 112 along direction 155. The floating gates 118 extend vertically away from the substrate 110 along direction 150. The floating gates 118 may be formed of polysilicon. Each memory cell 102, 104 may comprise one or more control gates 120 located adjacent to and laterally on either side of the floating gates 118 along direction 155. The control gates 120 also extend vertically away from the substrate 110 along direction 150. The control gates 118 may be formed of polysilicon. Both the floating gates 118 and the control gates 120 are electrically insulated from the substrate 110 by a dielectric material.

A first dielectric 122 is disposed between the body 112 and the floating gates 118. Vertical portions 122A of the dielectric form a tunnel dielectric between the body 112 and the floating gates 118. Horizontal portions 122B of the dielectric 122 isolate the floating gates 118 and the control gates 120 from the substrate 110 and the source 114. The vertical portions 122A of the dielectric 122 are adjacent to the body 112 and extend away from the substrate 110 along direction 150. The horizontal portions 122B of the dielectric 122 are adjacent to the substrate 110 and extend away from the body 112 along direction 155. In one embodiment, the horizontal portions 122B of the dielectric 122 extend below the floating gates 118 and the control gates 120, for example. In one embodiment, the dielectric 122 may be an oxide dielectric and forms a tunnel dielectric layer. A second dielectric 124 may be formed between each floating gate 118 and control gate 120. The second dielectric 124 forms a dielectric layer in region 129 between horizontal portions of the floating gates 118B and the control gates 120B. In one embodiment the second dielectric 124 may be an oxide-nitride-oxide (ONO) material, among other materials, for example.

In one embodiment, each floating gate 118 comprises a vertical member 118A extending along direction 150 and a horizontal member 118B extending along direction 155. In one embodiment, the vertical member 118A and the horizontal member 118B form an "L-shaped" floating gate structure in which the vertical member 118A is longer then the horizontal member 1118B. Each control gate 120 comprises a corresponding vertical member 120A extending along direction 150 and horizontal member 120B extending along direction 155. Each memory cell 102, 104 comprises a gate overlapping region 130 formed by the horizontal members 118B and 120B of each floating gate 118 and each control gate 120, respectively. The GCR between the floating gate 118 and the control gate 120 in each memory cell 102, 104 may be tuned or adjusted by controlling the horizontal length of each of the gate overlapping regions 130.

In one embodiment, the gate overlapping region 130 in each memory cell 102, 104 may be formed to increase the overall coupling capacitance between the floating gate 118 and the control gate 120. Thus, the gate overlapping region 130 may be formed to provide a greater GCR between the floating gate 118 and the control gate 120. In accordance with one embodiment, for example, a specific implementation and geometry of the gate overlapping region 130 may provide a GCR approaching the desired golden number of ~0.6. For example, in one embodiment, the gate overlapping region 130 may be designed to yield a GCR of approximately 0.57. In one embodiment, the L-shaped floating gate 118 structure may be adapted to increase the capacitive coupling between the floating gate 118 and the control gate 120 in three-dimensional vertical flash memory cell structures, for example. The capacitance between the floating gate 118 and the body 112 remains approximately the same as in conventional vertical gate memory structures. The embodiments, however, are not limited in this context.

Floating gates and control gates in conventional planar flash memory structures are horizontally disposed and extend along direction 155. In planar memory structures, a desired GCR approaching the golden number may be achieved by extending the overlapping portions of the floating gate and the control gate horizontally into an isolation area. The overlapping portions of such planar structures may be extended or adjusted until the desired GCR between the gates is achieved. In vertical memory cell structures, such as, the memory device 100 structure, for example, there is no equivalent horizontal isolation area along direction 155 into which the gates 118, 120 may be extended due to their vertical orientation. Rather, the floating gate 118 and the control gate 120 extend vertically along direction 150. To increase the capacitive coupling between the floating gate 118 and the control gate 120, and accordingly, to increase and tune the CGR to a predetermined or desired value (e.g., 0.6), the floating gate 118 and the control gate 120 are formed to include horizontal members 118B, 120B that extend along direction 155 and define a gate overlapping region 130 therebetween.

Although embodiments of the vertical memory device 100 may require increased capacitive coupling between the floating gates 118 and the control gates 120, the capacitive coupling between the floating gates 118 and the source 114 or the floating gates 118 and the substrate 110 should be minimized. In one embodiment, the capacitive coupling between the floating gates 118 and the source 114 or the floating gates 118 and the substrate 110 may be minimized or reduced by forming a suitable oxide layer therebetween using various semiconductor fabrication processes. As the memory cells 102, 104 are scaled to smaller dimensions, however, it may be difficult to form a suitably thick horizontal layer of the dielectric 122B using conventional tunneling dielectric material processing. A relatively thick structure may be formed using a dopant enhanced oxidation process to help reduce the capacitive coupling between the horizontal members 118B of the floating gates 118 and the source 114 and/or the substrate 110.

Accordingly, in one embodiment a layer of the first dielectric 122 of the memory device 100 may be formed using a dopant enhanced oxidation process to enhance the thickness of the horizontal dielectric 122B portion of the first dielectric 122 in the horizontal region between the floating gates 118B and the source 114 and the substrate 110 to reduce the gate 118 to source 114 and the gate 118 to substrate 110 coupling, for example. For example, in one embodiment, the dielectric 122 may be formed by a dopant enhanced oxidation process to reduce the capacitive coupling between the floating gates 118 and the source 114 or the floating gates 118 and the substrate 110. The dopant enhanced oxidation process forms a horizontal dielectric 122B having a thick layer around portions of the source 114 and the substrate 110 proximate the L-shaped floating gate 118. In one embodiment, if the drain 116 is formed, the dopant enhanced oxidation process may also forms a thick horizontal dielectric layer (not shown) above the drain 116, depending on the doping concentration. In one embodiment, the dopant enhanced oxidation process may be used in the integration process to form the memory device 100 and three-dimensional vertical flash memory structures in general, for example, that yield a suitable CGR. The embodiments, however, are not limited in this context. In another embodiment, the GCR of the memory device 100 may be adjusted by using a high "K" dielectric material to control the capacitance between the floating gate 118 and the control gate 120, for example. The embodiments, however, are not limited in this context.

Figure 2:
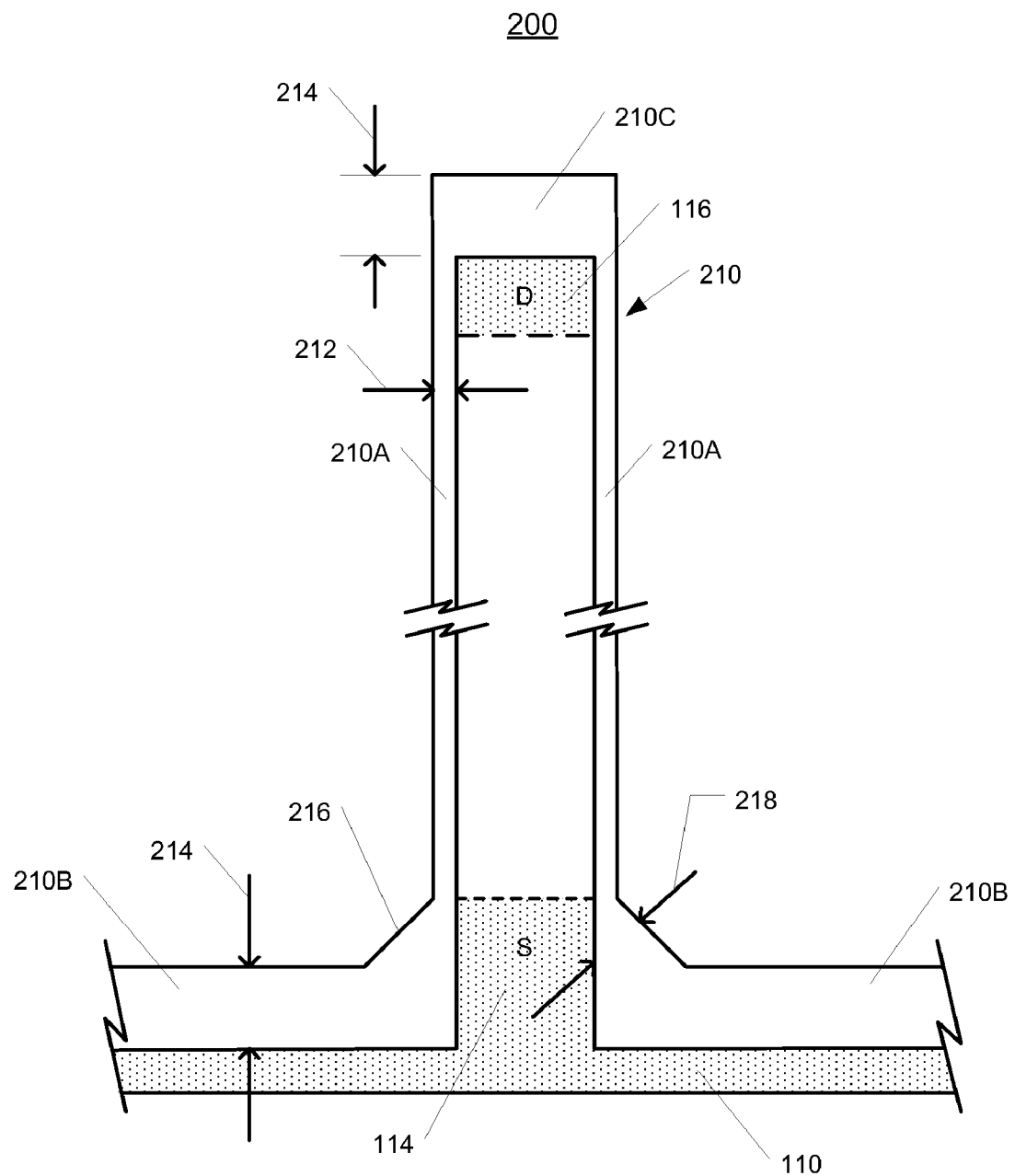
FIG. 2 illustrates a diagram of one embodiment of the memory device 100 comprising a dielectric formed thereon.

FIG. 2 illustrates a diagram 200 of one embodiment of the memory device 100 comprising a dielectric 210 formed using a dopant enhanced oxidation process. The dopant enhanced oxidation process may be used to provide a suitable thickness of the dielectric 210B between the gates 118 and the substrate 110 and between the gates 118 and the source 114 regions to reduce the coupling between the gates 118 and the source 114 and the gates 118 and the substrate 110. The diagram 200 also illustrates a transition region 216 in a detailed and magnified view. The dielectric 210 layer has vertical portions 210A with a thickness 212 and horizontal portions 210B, C with a thickness 214. The thickness 214 of the horizontal portions 210B between the horizontal members 118B (FIG. 1) of each floating gate 118 (FIG. 1) and the substrate 110 may be adjusted to reduce the capacitive coupling between the floating gates 118 and the source 114 and between the floating gates 118 and the substrate 110. The drain 116 may be formed at different stages of processing, for example. In one embodiment, if the drain 116 is formed prior to the dopant enhanced oxidation process, the horizontal portion 210C of the dielectric layer 210 above the drain 116 also may be formed with thickness 214. In one embodiment, the thickness 214 of the horizontal portions 210B and 210C may be slightly different. In one embodiment, the thickness 214 of the horizontal portion 210B of the dielectric 210 may be three to six thicker than the thickness 212 of the vertical portion 210A of the dielectric 210 between the floating gates 118 and the body 112. In one embodiment, when the dopant enhanced oxidation dielectric 210 is formed, the transition region 216 may be formed proximate the source 114. The dopant enhanced oxidation dielectric 210 layer in the transitional region 216 is generally substantially thick 218 and may reduce any unwanted capacitive coupling between the floating gates 118 (FIG. 1) and the substrate 110 and around the source 114. In one embodiment, three-dimensional flash memory cell structures may be formed using an enhanced oxidation process.

Figure 3:
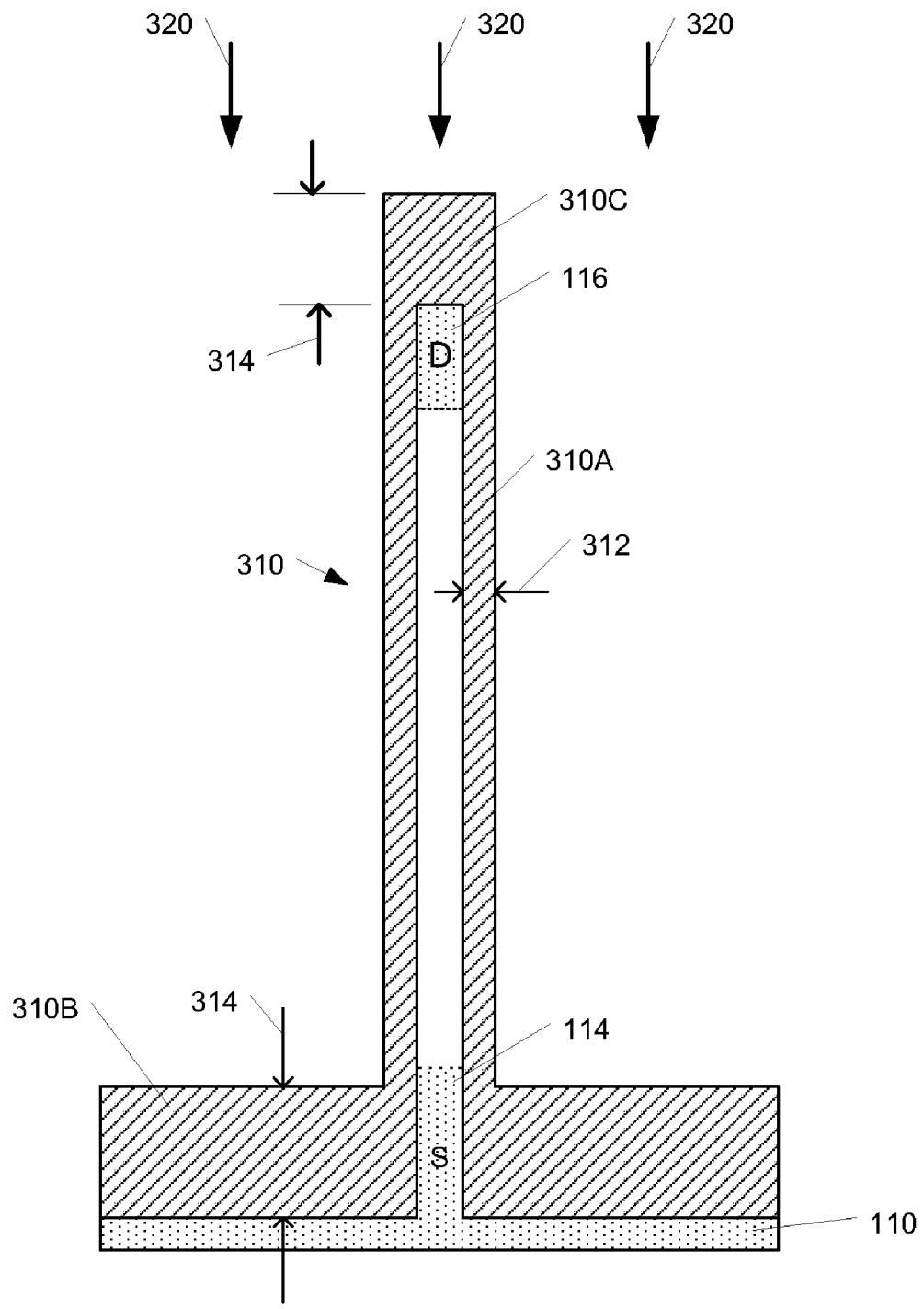
FIG. 3 illustrates a diagram of one embodiment of a subcomponent of the memory device 100.

FIG. 3 illustrates a diagram 300 of one embodiment of a subcomponent of the memory device 100 (FIG. 1) floating gates 118 (FIG. 1) with a layer of dielectric 310 formed using a directional deposition process. In one embodiment, this may comprise using a non-conformal directional deposition. The dielectric 310 material is deposited in the direction indicated by deposition direction 320, which may be referred to as the vertical direction. A directional deposition process forms a thinner layer of material on vertical surfaces extending parallel to the deposition direction 320 and it forms a much thicker layer of material on surfaces that are substantially orthogonal, horizontal, to the deposition direction 320. Accordingly, a relatively thin layer of tunneling dielectric 310A of thickness 312 is formed on vertical surfaces parallel to the deposition direction 320 and relatively thick layers of dielectric 310B, C of thickness 314 are formed on horizontal surfaces substantially orthogonal to the deposition direction 320. Thus, thickness 314 of the horizontal layers of the dielectric 310B, C are thicker than the thickness 312 of the vertical layers of the dielectric 310. In one embodiment, the thickness 314 of the horizontal layers of the dielectric 310B and 310C may be slightly different. In one embodiment, the thickness 314 of the horizontal layers of the dielectric 310B helps to isolate the floating gates 118 (FIG. 1) from the source 114 and the substrate 110. One example of a directional dielectric deposition process to form a layer of the dielectric 310 is a jet vapor deposition process comprising $Si_3N_4$. The directionality of the jet vapor deposition process provides a relatively thick layer of dielectric 310B and a relatively thin layer of dielectric 310A in which the dielectric 310B is thicker than the dielectric 310A. This reduces the capacitive coupling between the floating gates 118 and the source 114 and the floating gates 118 and the substrate 110. The embodiments, however, are not limited in this context. The directional dielectric deposition processes also may provide a thicker layer of dielectric 310B layer in the source 114 and substrate 110 regions to reduce floating gate 118 to source 114 and/or substrate 110 coupling, for example. The embodiments, however, are limited in this context.

Figure 4:
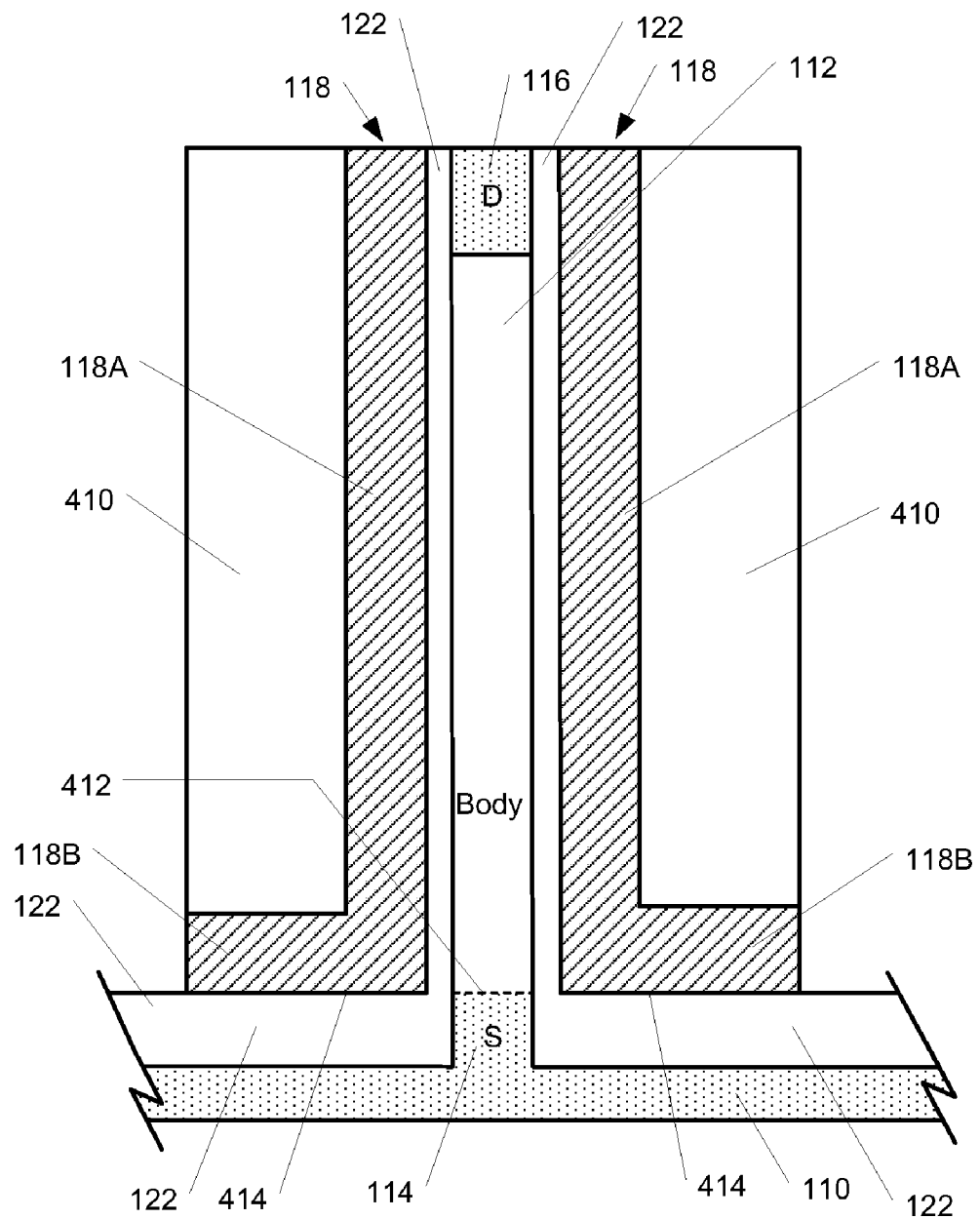
FIG. 4 illustrates a diagram of one embodiment of a floating gate component of the memory device 100.

FIG. 4 illustrates a diagram 400 of one embodiment of the floating gate 118 formed using a sacrificial oxide spacer 410. In one embodiment, the spacer 410 may be formed using plasma enhanced chemical vapor deposition (PECVD) techniques, for example. The source 114 may be formed such that its profile top 412 is even or level with the bottom 414 portion of the horizontal members 118B of the floating gates 118. In subsequent processing steps, the sacrificial oxide spacer 410 is removed to form the second dielectric 124 layer (FIG. 1).

FIGS. 5A-5J illustrates various embodiments of processes and integration techniques to realize the L-shaped floating gates 118 of the memory device 100 (FIG. 1). Those skilled in the art will appreciate that the figures are not drawn to scale and some details may have been omitted for simplicity while some details may not have been specifically described.

Figure 5A:
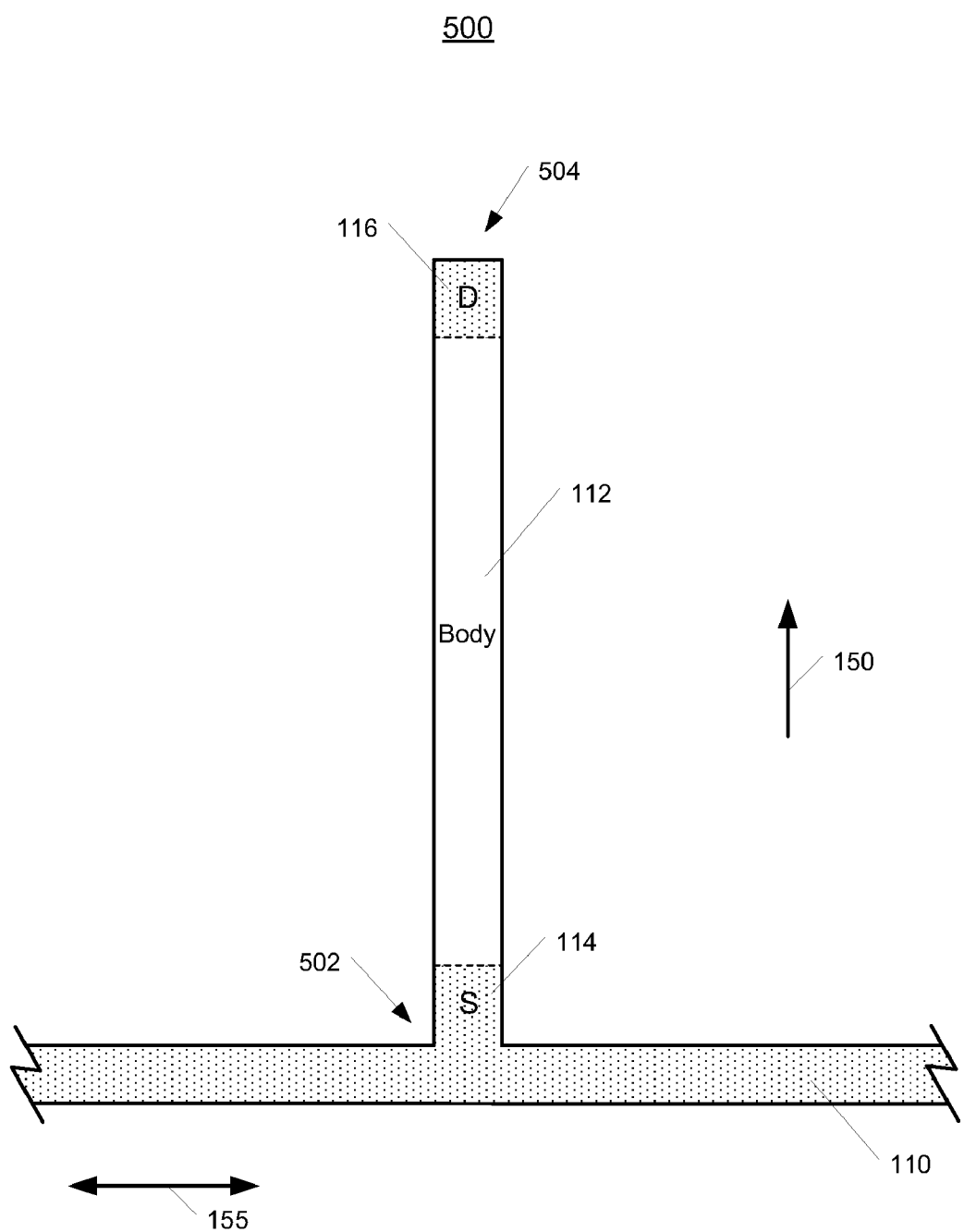
FIGS. 5A-5J illustrate various embodiments of processes and integration techniques to realize one embodiment of the memory device 100.

FIG. 5A illustrates a schematic cross-sectional view of one embodiment of a starting structure 500 comprising a substrate 110, a body 112, a source 114, and a drain 116. Those skilled in the art will appreciate that the drain 116 may be implanted at later stages of the semiconductor process and the initial starting structure 500 may contain the substrate 110, body 112, and the implanted source 114. In one embodiment, the body 112 is formed of Si. The starting structure 500 is formed with heavy implant regions for the source 114 and the substrate 110. The body 112 extends vertically from the substrate 110 along direction 150 and the substrate 110 extends horizontally on either side of the body 112 along direction 155.

The source 114 is formed by implants and is located at a near end 502 where the body 112 joins the substrate 110. The drain 116, which may be formed by implants during subsequent processing steps, is located at a distal end 504.

Figure 5B:
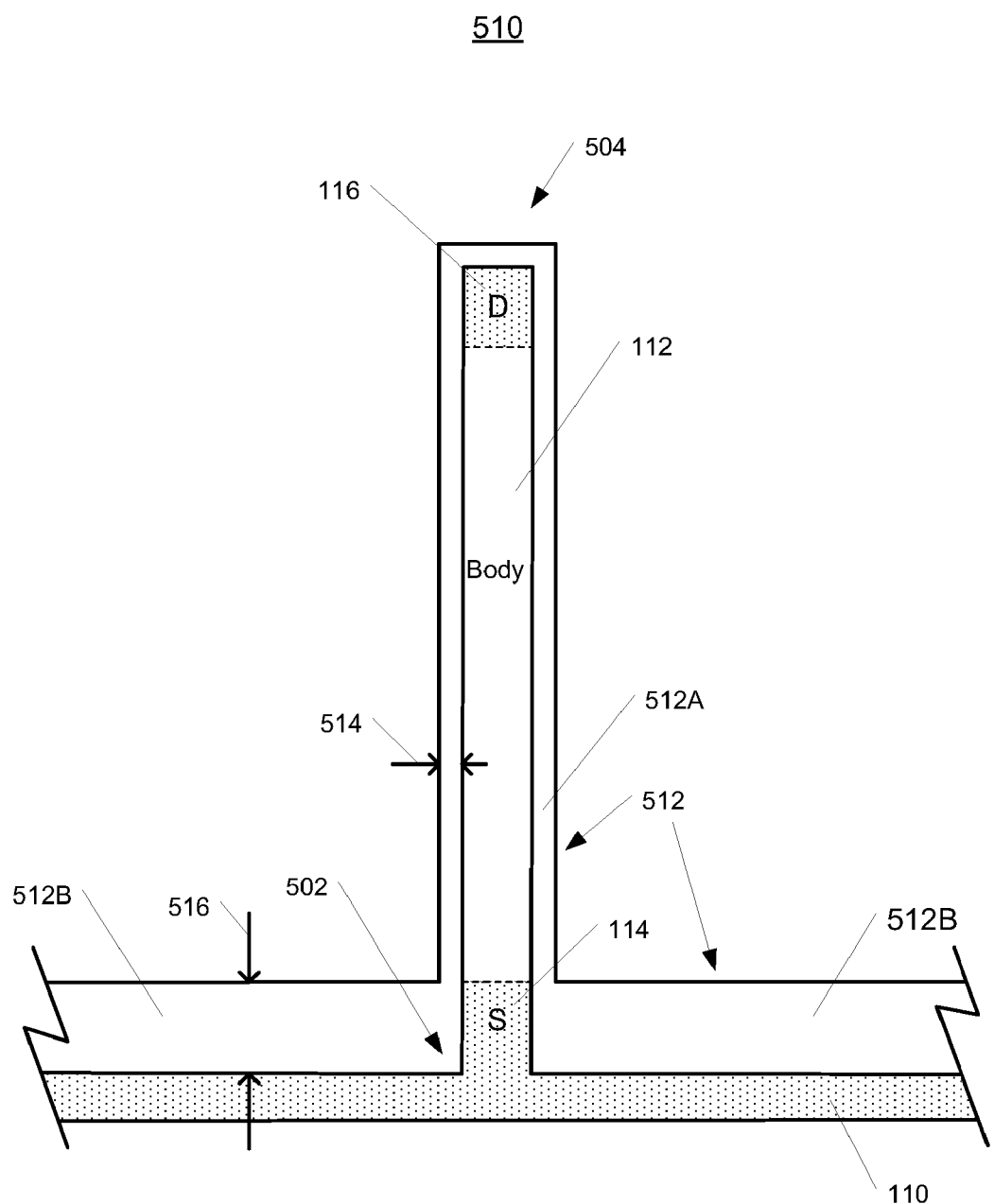

FIG. 5B illustrates generally at 510 one embodiment of the starting structure 500 shown in FIG. 5A with a dielectric layer 512 formed thereon. The dielectric layer 512 covers the substrate 110 and the body 112. The dielectric layer 512 has vertical portions 512A of thickness 514 to form a tunnel dielectric layer, for example. In one embodiment, the dielectric layer 512 may be an oxide layer and may form a tunnel dielectric oxide layer between the floating gates 118 (FIG. 1) and the Si body 112. The dielectric layer 512 also has horizontal portions 512B of thickness 516 to form an isolation layer, for example. The thickness 516 of the horizontal portions 512B adjacent to the heavily doped substrate 110 and the source 114 is greater than the thickness 514 of the vertical portions 512A forming the tunnel dielectric layer surrounding the body 112. In one embodiment, thickness 516 may be three to six greater than thickness 514. For example, thickness 516 may range from 21 nm to 42 nm while thickness 514 may range from 5 nm to 9 nm. In one embodiment, as described above with reference to FIG. 2, the dielectric layer 512 may be formed using a dopant enhanced oxidation technique. In other embodiments, as described above with reference to FIG. 3, the oxide layer may be formed using directional deposition techniques. In one embodiment, the dielectric layer 512 may be formed of silicon dioxide ($SiO_2$) surrounding the body 112 and covering the substrate 110. Regardless of whether the dielectric oxide is formed using a dopant enhanced oxidation or directional deposition process, the thickness 516 of the horizontal portions 512B of the dielectric layer 512 over the substrate 110 and the source 114 is made sufficiently thick to reduce the coupling between the floating gates 118 (FIG. 1) and the source 114 and between the floating gates 118 and the substrate 110.

Figure 5C:
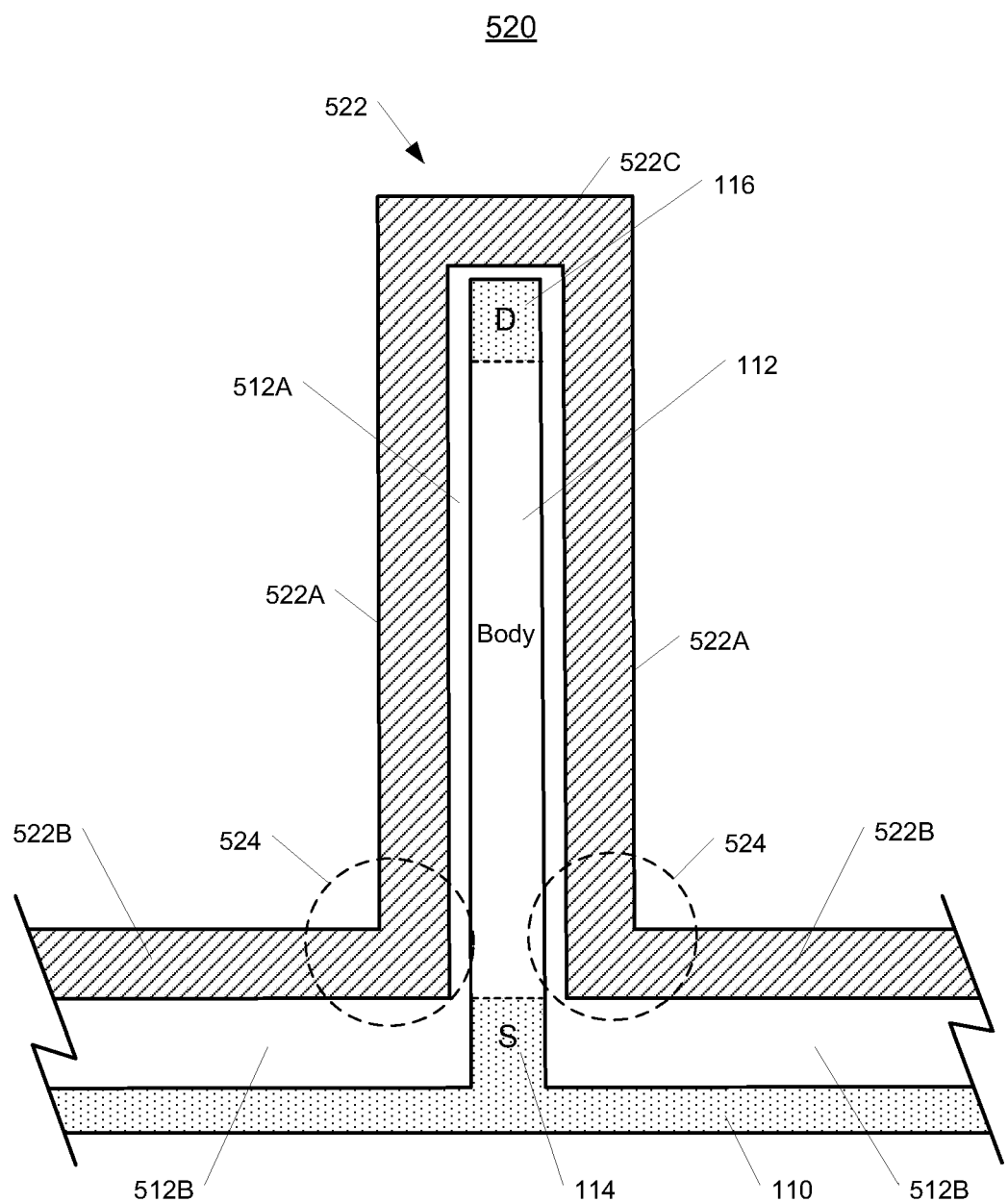

FIG. 5C illustrates generally at 520 one embodiment of the structure 510 shown in FIG. 5B with a conformal polysilicon layer 522 formed over the dielectric layer 512. The conformal polysilicon layer 522 may be formed of polycrystalline silicon (polysilicon), for example. The polysilicon layer 522 surrounds the dielectric layer 512. The polysilicon layer 522 has vertical portions 522A surrounding the vertical portions 512A of the dielectric layer 512 around the vertical body 112 and has horizontal portions 522B covering horizontal portions 512B of the dielectric layer 512 over the substrate 110. The horizontal portions 522B of the polysilicon layer 522 extend laterally from the body 112 above the dielectric layer 512B covering the substrate 110. Another horizontal portion 522C bridges the two vertical portions 522A. In subsequent processing steps portions of the polysilicon layer 522 may be etched and polished to remove unwanted poly parts to form the two L-shaped floating gates 118 in the memory cells 102, 104 of the memory device 100 (FIG. 1), for example. Dielectric layer 512 (e.g., $SiO_2$) electrically isolates the polysilicon layer 522 from the body 112. The thickness 516 of the horizontal portions 512B of the dielectric layer 512 is selected to electrically isolate the horizontal portions 522B of the polysilicon layer 522 from the substrate 110 and the source 114. In region 524, the laterally extending horizontal portions 522B of the polysilicon layer 522 eventually form the L-shaped structure 524 of the floating gates 118 (FIG. 1).

Figure 5D:
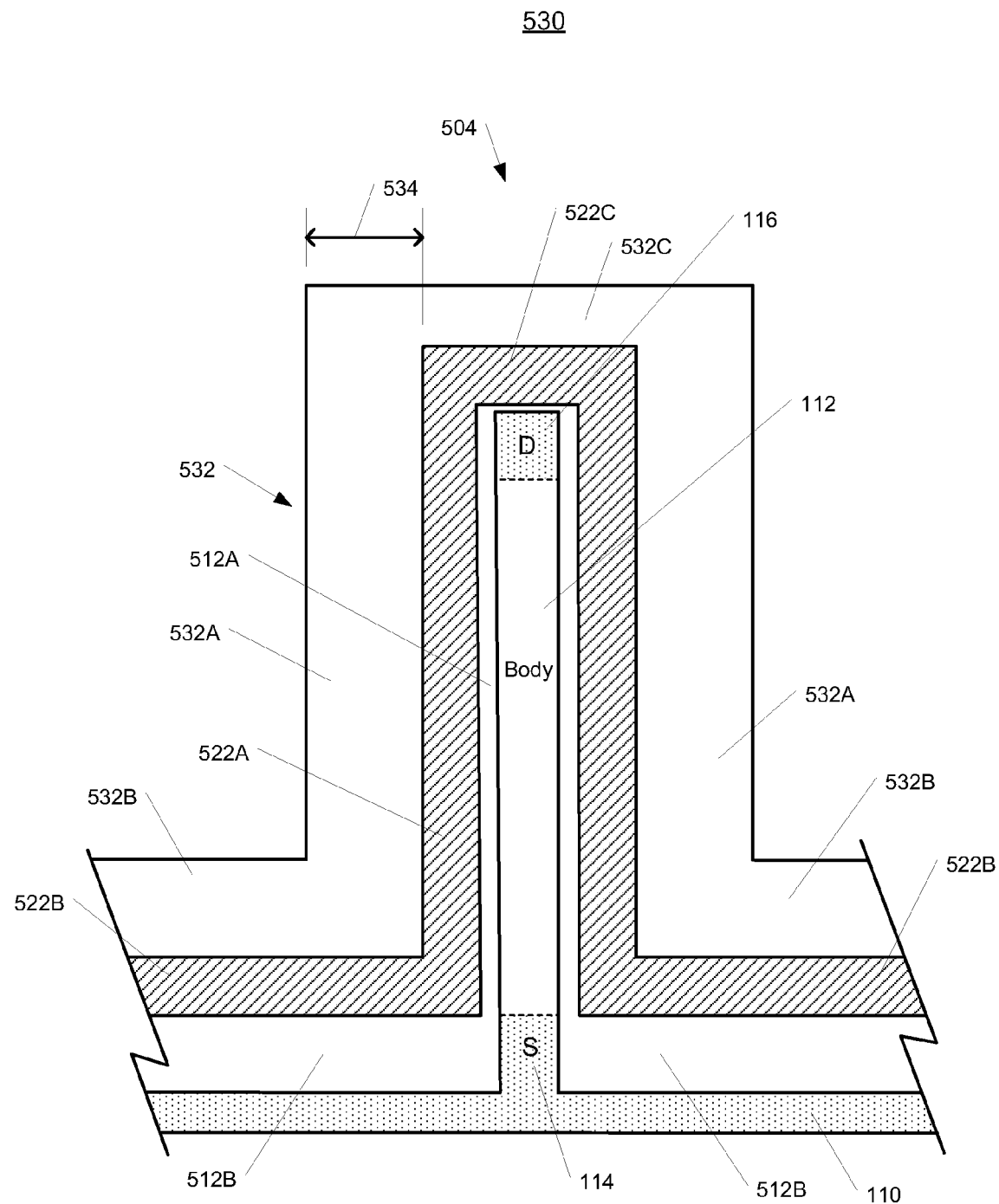

FIG. 5D illustrates generally at 530 one embodiment of the structure 520 shown in FIG. 5C with a conformal spacer layer 532 formed over the polysilicon layer 522. The conformal spacer layer 532 has vertical portions 532A adjacent to the vertical portions 522A of the polysilicon layer 522. The conformal spacer layer 532 also has horizontal portions 532B extending laterally from the base of the body 112 above the horizontal portions 522B of the polysilicon layer 522. The conformal spacer layer 532 also has an horizontal portion 532C at the distal end 504 of the body 112. In one embodiment, the conformal spacer layer 532 has a width 534. In one embodiment, the conformal spacer layer 532 serves as a directional oxide spacer. In one embodiment, the conformal spacer layer 532 may be formed using a chemical vapor deposition (CVD) technique, for example, although other techniques may be employed. In one embodiment, the spacer layer 532 may be formed using a $Si_3N_4$ layer instead of using an oxide spacer, for example.

Figure 5E:
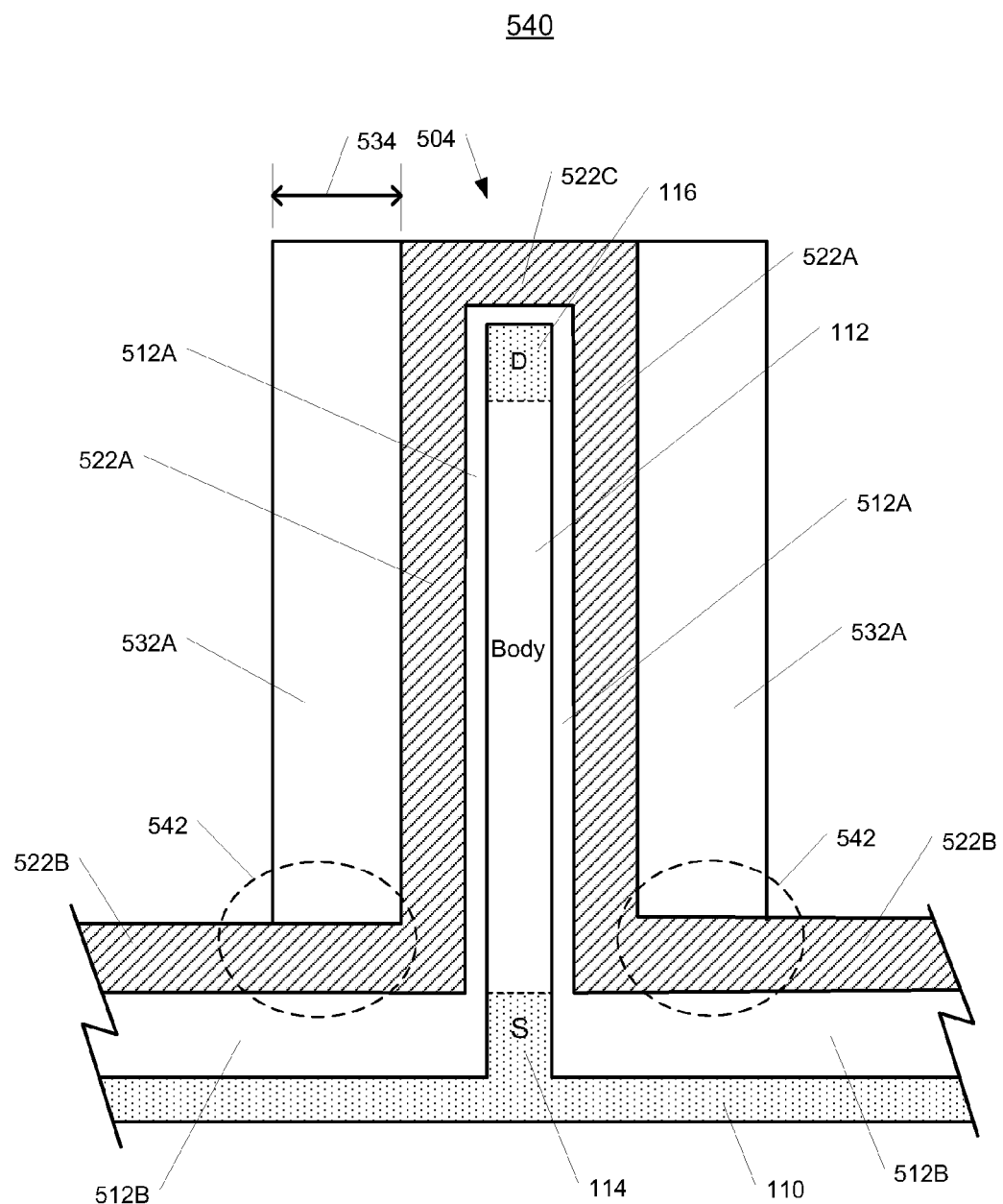

FIG. 5E illustrates generally at 540 one embodiment of the structure 530 shown in FIG. 5D after etching the conformal spacer layer 532 (e.g., the directional oxide spacer). The etching process is a vertical process and thus it removes the horizontal portions 532B (FIG. 5D) of the spacer layer 532. The etching process also removes the horizontal portion 532C (FIG. 5D) of the spacer layer 532 at the distal end 504 of the body 112. The width 534 of the oxide spacer 532 determines the horizontal extension of the 'L' portion of the floating gates 118 (FIG. 1) as shown at 542, for example. The width 534 of the oxide spacer 534 layer provides for self-aligned, precise control of the horizontal extension of the 'L' portion of the floating gates 118 (FIG. 1). The vertical portions 532A of the spacer layer 532 adjacent to the body 112 remain substantially intact during the etching process and are left behind to act as a mask for the process illustrated with reference to FIG. 5F below.

Figure 5F:
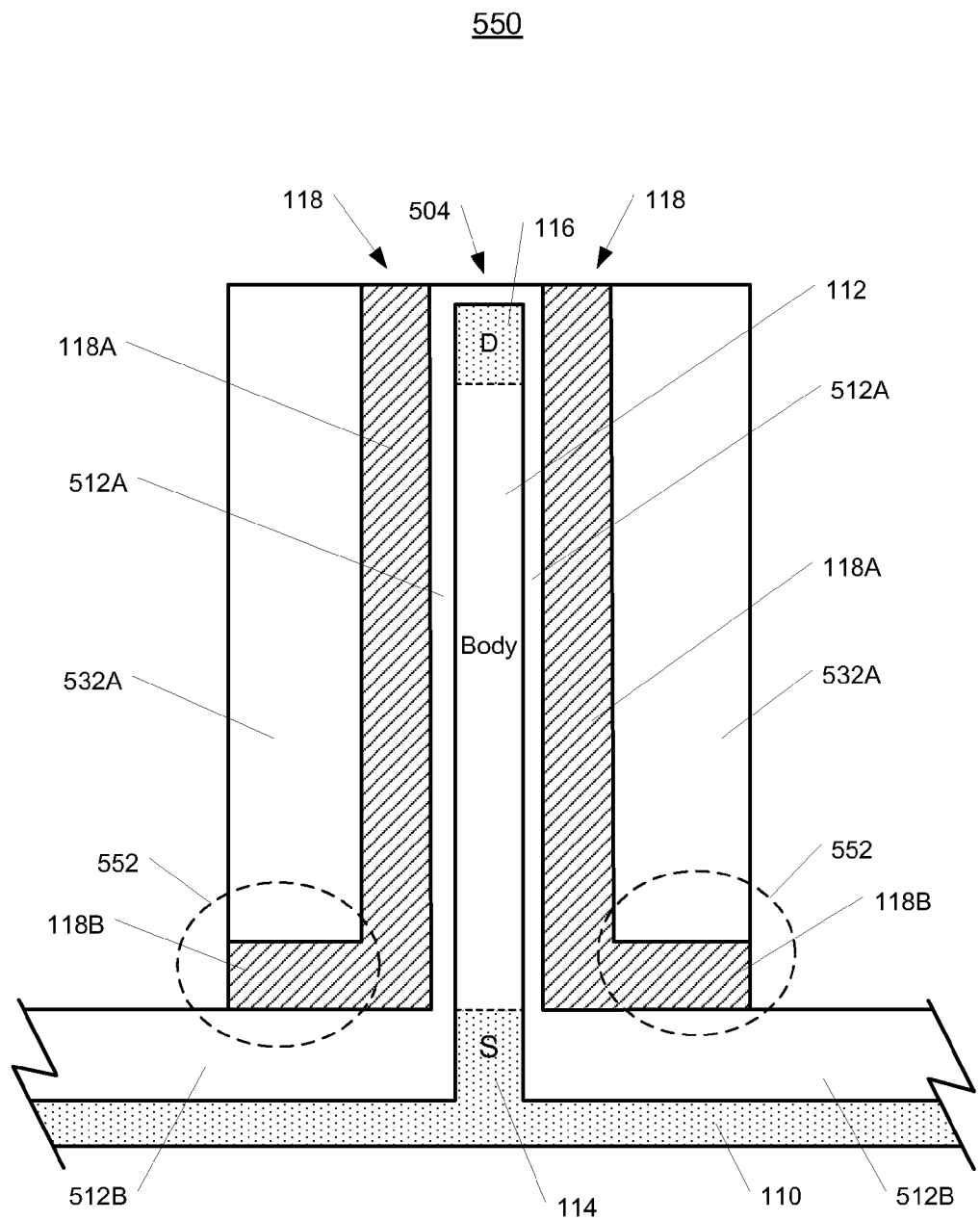

FIG. 5F illustrates generally at 550 one embodiment of the structure 540 shown in FIG. 5D after etching the polysilicon spacer layer 532 mask. The etching process also removes the horizontal portions 522B (FIGS. 5C-5E) of the polysilicon layer 522 that extend laterally beyond the width 534 of the spacer layer 532 as shown at 552, for example. The etching process also removes the horizontal portion 522C (FIGS. 5C-5E) of the polysilicon layer 522 at the distal end 504 of the body 112. Removing the horizontal portions 522B that extend laterally beyond the width 534 of the spacer layer and the horizontal 522C at the distal end 504 forms the L-shaped floating gate 118, which is now exposed in the polysilicon layer 522.

Figure 5G:
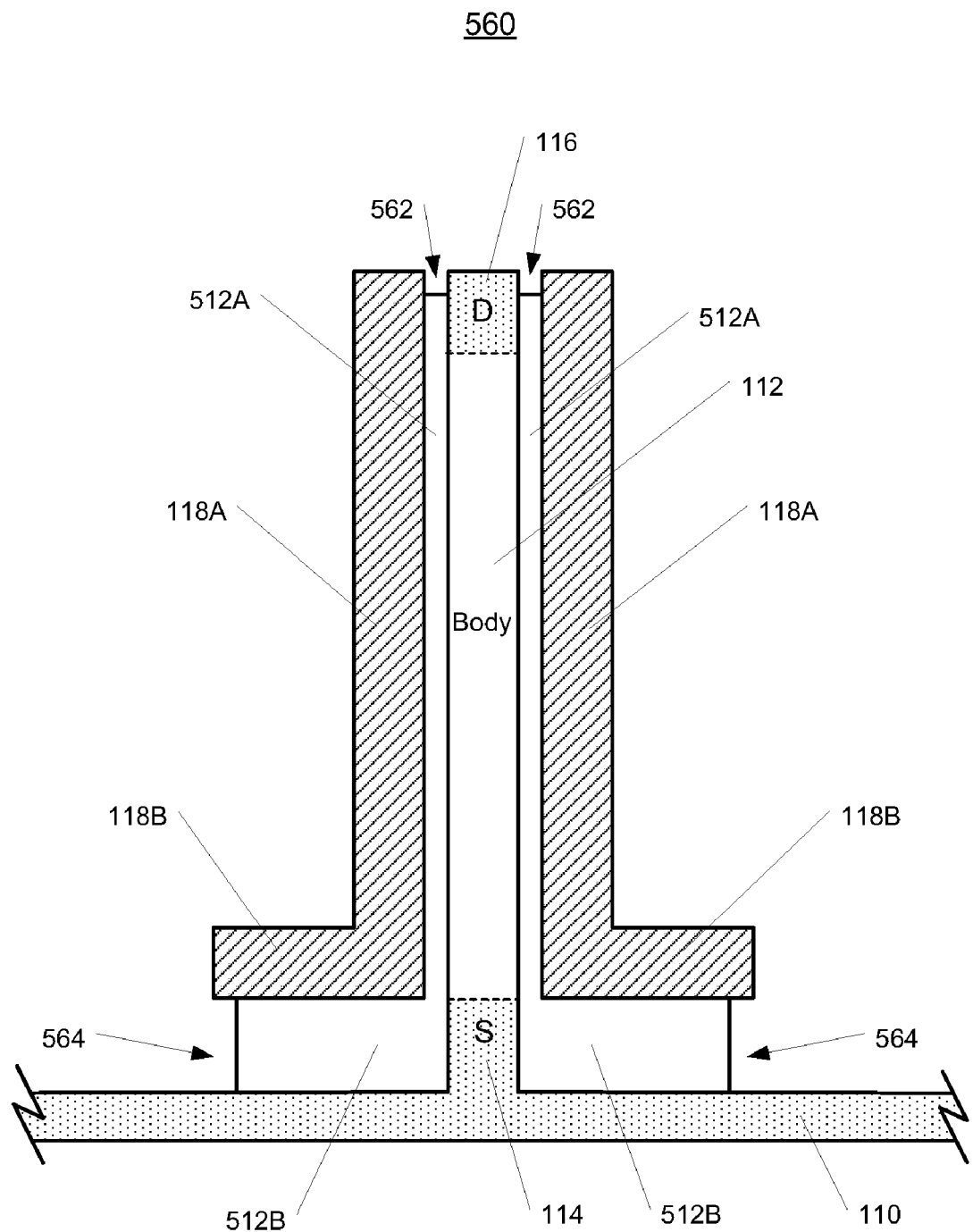

FIG. 5G illustrates generally at 560 one embodiment of the structure 550 shown in FIG. 5F after wet or dry etching to remove the spacer layer 532. Some of the dielectric layer 512 between the polysilicon gate 522 and the Si body 112 also is removed in the process. In one embodiment, the dielectric layer 512 may be a thermal oxide, or any oxide, that etches at a much slower rate than the spacer layer 532. Accordingly, the dielectric layer 512 does not completely wash away during the wet etching process. Further, in one embodiment, the dielectric layers 512A between the polysilicon gate 522 and the body 112 are relatively thin and will not wash away because the wet etching process is self-limiting due to the capillary effect. Although, some erosion or washing away of the dielectric layer 512 may occur at regions 562 and 564, the bulk of the material remains substantially intact. After wet or dry etching, the polysilicon gates 118 on either side of the body 112 are exposed and the structure 560 is ready for receiving a second dielectric layer thereon. In one embodiment, if a $Si_3N_4$ layer is used as a spacer instead of the oxide spacer to form spacer layer 532, the $Si_3N_4$ layer may be selectively etched by $H_3PO_4$ over the dielectric layer 512, for example.

Figure 5H:
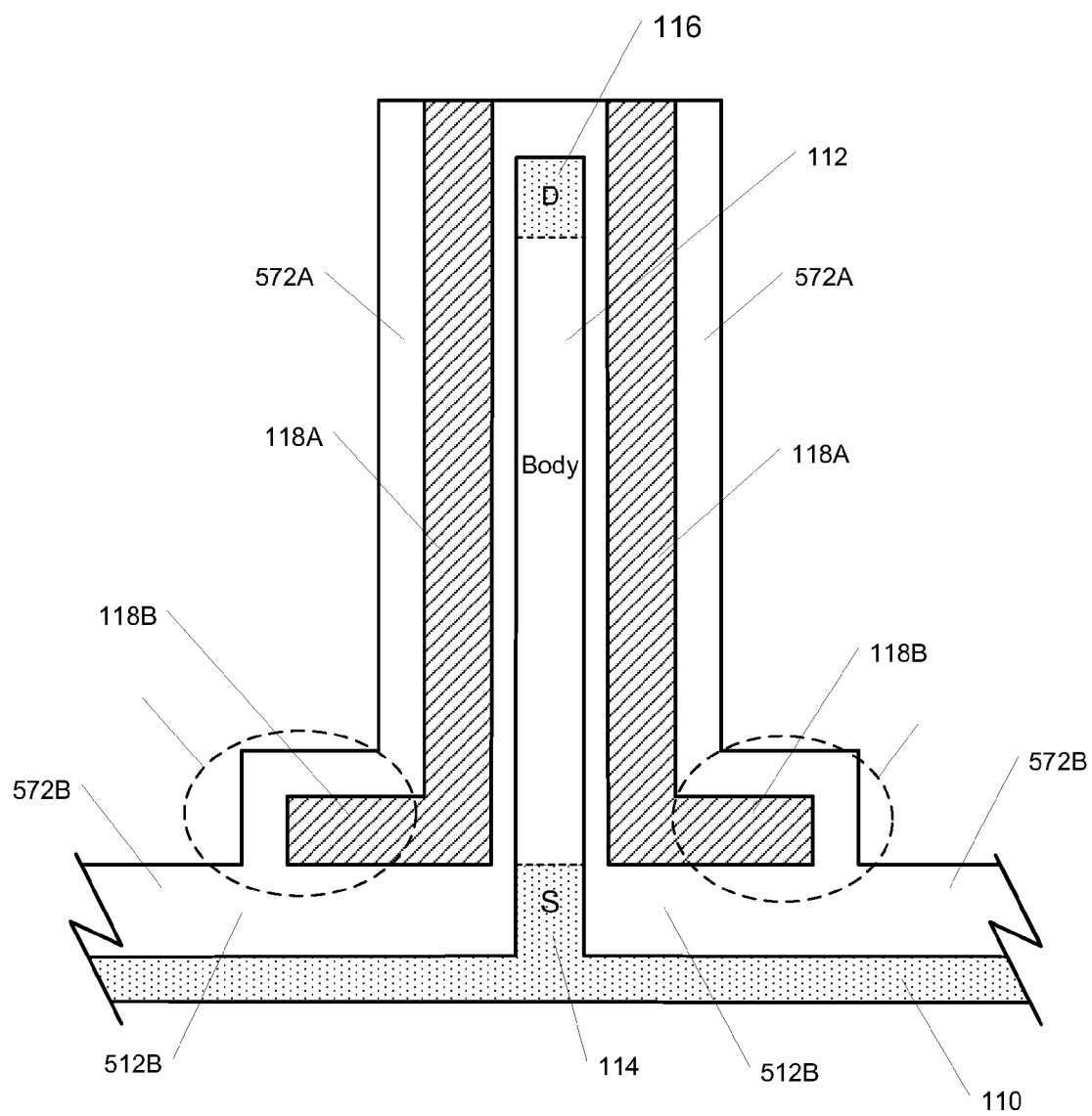

FIG. 5H illustrates generally at 570 one embodiment of the structure 560 shown in FIG. 5G with a dielectric layer 572 formed thereon. In one embodiment, the dielectric layer 572 may be an oxide-nitride-oxide (ONO) layer and may be formed using various chemical vapor deposition techniques, for example. The dielectric layer 572 may be formed around the floating gate 118 on either side of the body 112, for example. As shown at 574, the dielectric layer 572 surrounds the floating gate 118 and extends horizontally away from the body 112 along a horizontal surface adjacent to the substrate 110. The structure 570 is now ready for the formation of the control gate 120 (FIG. 1).

Figure 5I:
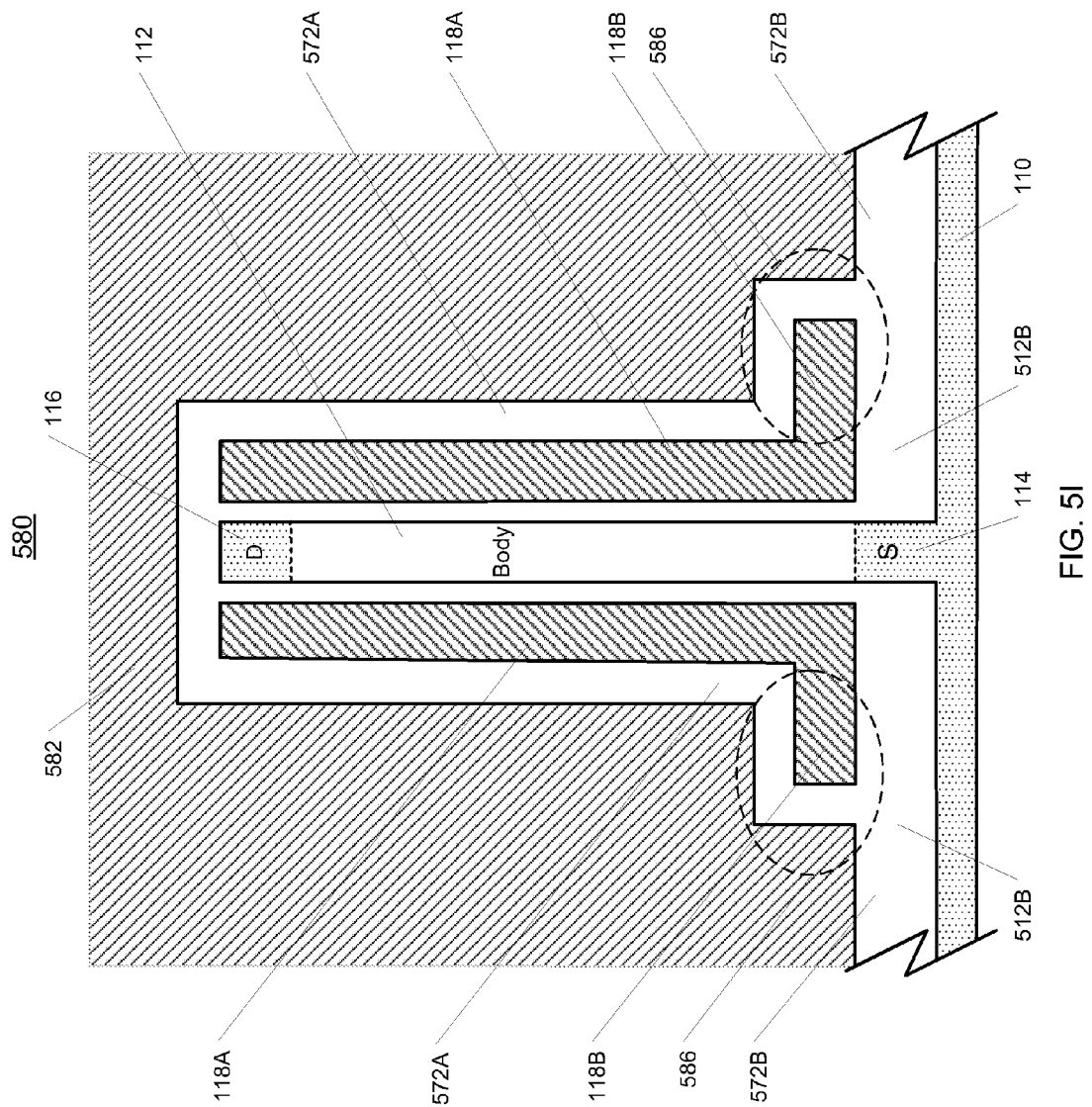

FIG. 5I illustrates generally at 580 one embodiment of the structure 570 shown in FIG. 5H with a second polysilicon layer 582 formed thereon. The second polysilicon layer 582 is used to form the control gates 120 (FIG. 1). The overlapping region 586 of the horizontal portions of the floating gates 118B and the second polysilicon layer 582 increases the capacitive coupling ratio between the second polysilicon layer 582 and the floating gate layer 118.

Figure 5J:
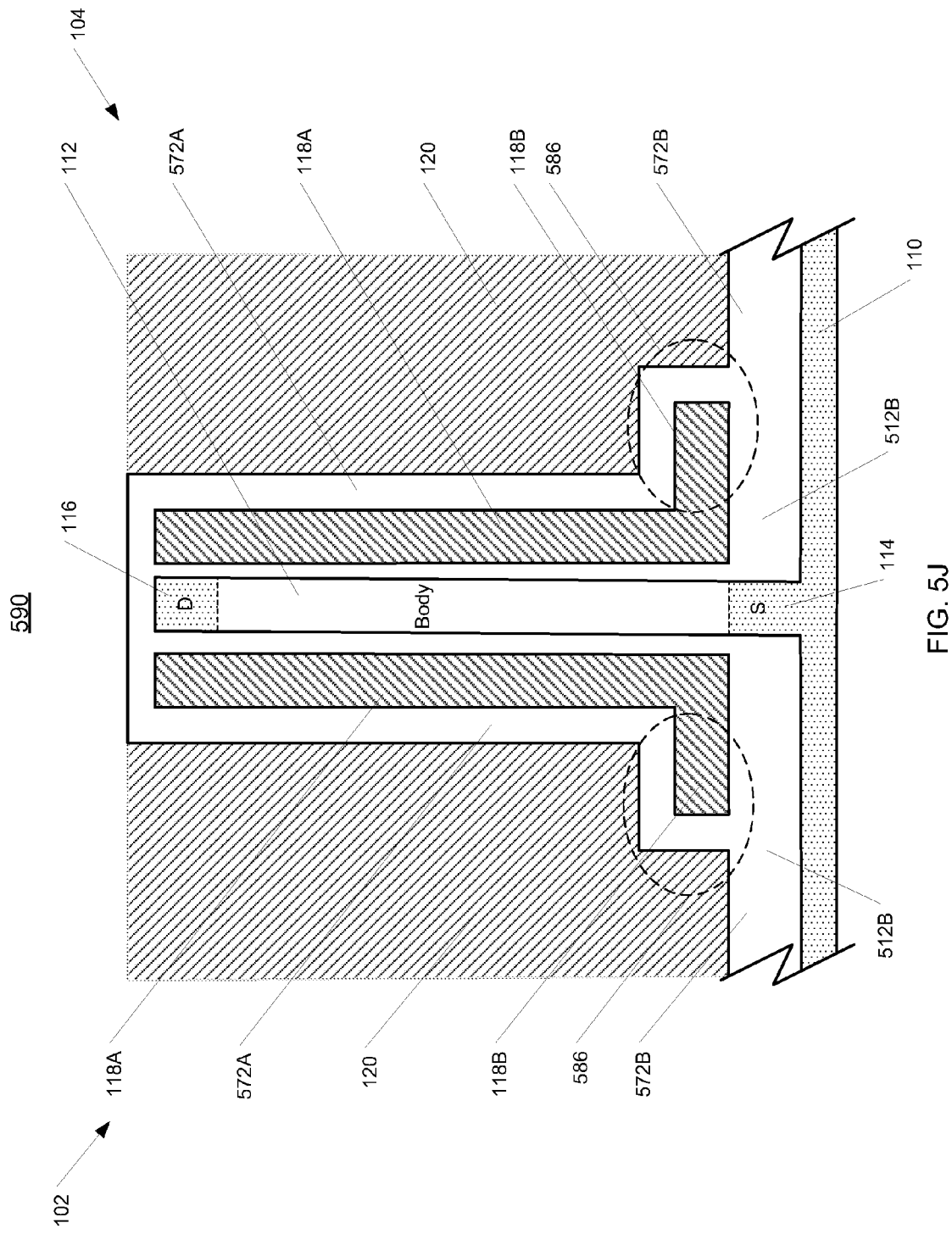

FIG. 5J illustrates one embodiment of a memory device 590, which may be one embodiment of the structure 580 shown in FIG. 5I after a chemical mechanical planarization (CMP) polishing process to form the control gates 120 out of the second polysilicon layer 582 (FIG. 5I). The memory device 590 is one embodiment of the memory device 100 (FIG. 1) comprising first memory cell 102 and second memory cell 104 formed back-to-back with a common body 112. The overlapping regions 586 of the horizontal members 118B of the polysilicon floating gates 118 and the control gates 120 provide a larger coupling region between the floating gates 118 and the control gates 120 in the overlapping regions 586. The greater coupling region between the floating gates 118 and the control gates 120 in the overlapping regions 586 increases the capacitive coupling ratio (CGR) therebetween. A memory array comprising multiple memory devices 590 comprising multiple first and second memory cells 102, 104 may be formed on the substrate 110 using the process steps described with reference to FIGS. 5A-5J.

Figure 6:
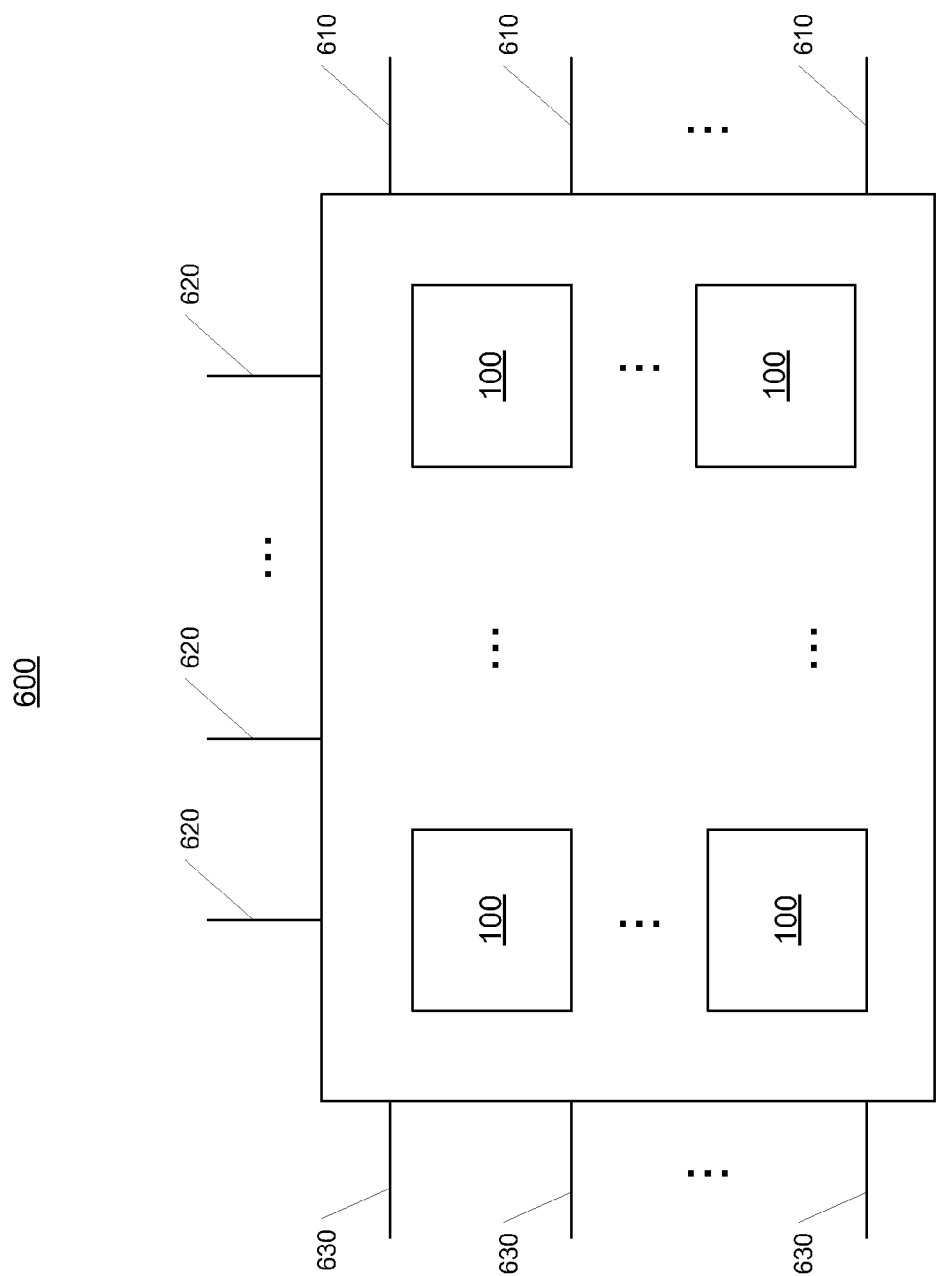
FIG. 6 illustrates one embodiment of a memory 600.

FIG. 6 illustrates one embodiment of a memory array 600. The memory comprises an array multiple memory devices 100. The memory array 600 comprises multiple gate lines 610 and drain lines 620. The control gates 120 of the memory devices 100 are connected to the gate lines 610, where a decoded address may be applied to the memory array 600. The drain lines 620 connect the drains 116 of the memory cells together and may represent a data bus, for example. The sources 114 of the memory devices 100 may be connected to common ground thorough source lines 630. The embodiments, however, are not limited in this context.

Manufacture of the above memory devices 100, 590 and the memory array 600 may be further described with reference to the following figure and accompanying examples describing a process flow. The figures includes processing logic and although the figure presented herein may include a particular process, it can be appreciated that the processing flow merely provides an example of one embodiment of how a manufacturing process for the memory devices and systems described herein may be implemented. The embodiments are not limited in this context.

Figure 7:
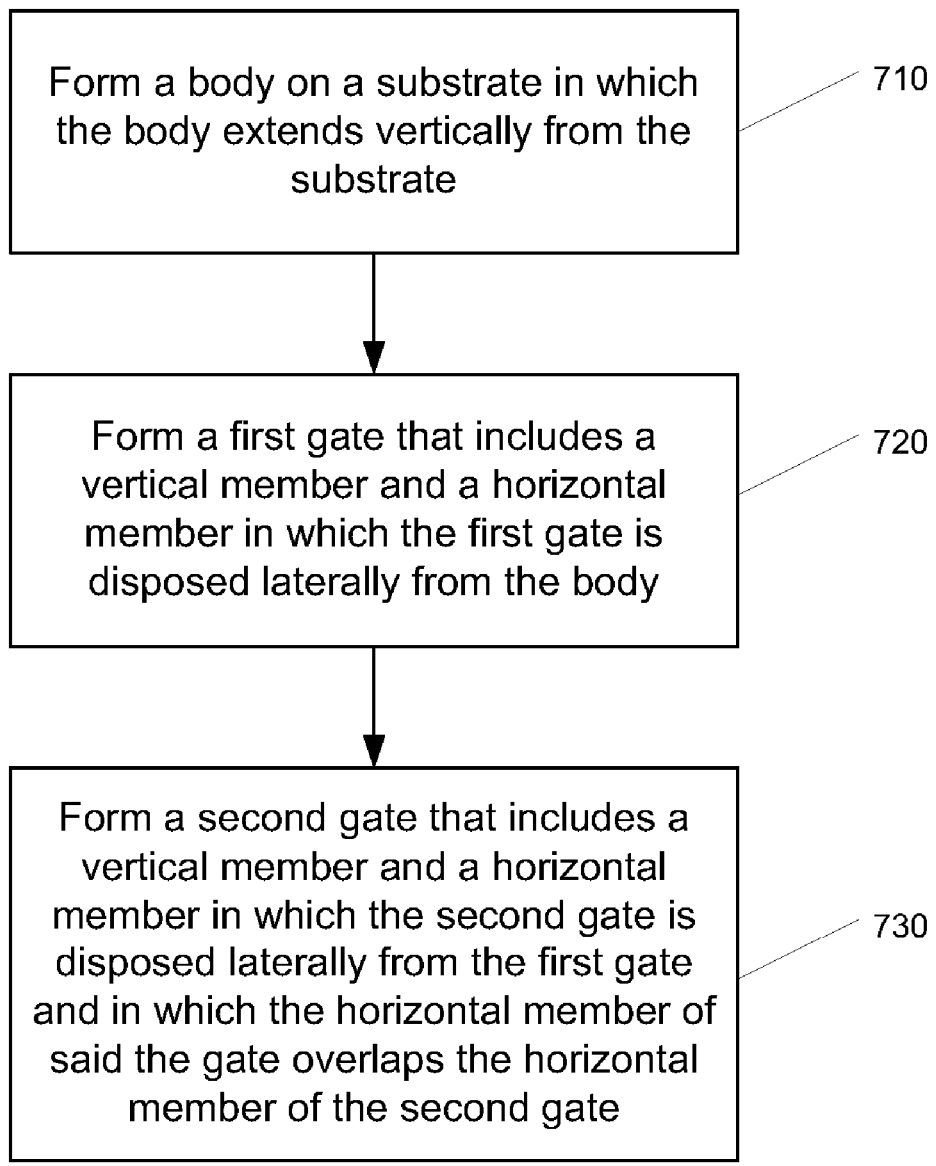
FIG. 7 illustrates one embodiment of a process flow diagram 700.

FIG. 7 illustrates one embodiment of a process flow diagram 700 to form the memory devices 100, 590 and the memory array 600 comprising memory cells 102 and 104 described herein. Accordingly, at block 710, a body may be formed on a substrate in which the body extends vertically from the substrate. At block 720, a first gate comprising a vertical member and a horizontal member may be formed in which the first gate is disposed laterally from the body. At block 730, a second gate comprising a vertical member and a horizontal member may be formed in which the second gate is disposed laterally from the first gate and in which the horizontal member of the first gate overlaps the horizontal member of the second gate. Other embodiments of the process described with reference to process flow diagram 700 include a spacer layer having a width formed around the first gate, wherein the width determines a horizontal extension of the horizontal member of the first gate. Further, a first dielectric layer may be formed between the first gate and the body. Further, the first dielectric may be formed with a vertical portion having a first thickness adjacent to the body and a horizontal portion having a second thickness adjacent to the substrate in which the second thickness is greater than the first thickness, for example. In addition, the first dielectric may be formed using a dopant enhanced oxidation process or may be formed using a directional dielectric deposition process, among other processes, for example. Other embodiments of the process described with reference to process flow diagram 700 include a second dielectric formed between the first and the second gates. Further, the second dielectric may be formed with an oxide-nitride-oxide. Other embodiments of the process described with reference to process flow diagram 700 include a horizontal overlapping region of the first and the second gates formed such that the capacitive coupling ratio between the first and second gates is between 0.3 and 0.6, for example.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be described using the expression "connected" along with its derivatives. Some embodiments may be described using the term "connected" to indicate that two or more elements are in direct physical or electrical contact with each other. The term "connected" as used herein may indicate that two or more elements are in direct physical or electrical contact and/or that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A method of making a memory cell, comprising:
   forming a body on a substrate, said body extending vertically from said substrate;
   forming a first gate comprising a vertical member and a horizontal member, wherein said first gate is disposed laterally from said body; and forming a second gate comprising a vertical member and a horizontal member, wherein said second gate is disposed laterally from said first gate;

wherein said horizontal member of said first gate overlaps said horizontal member of said second gate.

2. The method of claim 1, further comprising forming a spacer layer having a width around said first gate, wherein said width determines a horizontal extension of said horizontal member of said first gate.

3. The method of claim 1, further comprising forming a first dielectric layer between said first gate and said body.

4. The method of claim 3, wherein forming said first dielectric comprises forming a vertical portion having a first thickness adjacent to said body and forming a horizontal portion having a second thickness adjacent to said substrate, wherein said second thickness is greater than said first thickness.

5. The method of claim 4, wherein forming said first dielectric comprises forming said first dielectric using a dopant enhanced oxidation process.

6. The method of claim 4, wherein forming said first dielectric comprises forming said first dielectric using a directional dielectric deposition process.

7. The method of claim 1, further comprising forming a second dielectric between said first and second gates.

8. The method of claim 7, wherein forming said second dielectric comprises forming an oxide-nitride-oxide.

9. The method of claim 1, further comprising forming a horizontal overlapping region of said first and second gates wherein a capacitive coupling ratio between said first and second gates is between 0.3 and 0.6.

* * * * *